United States Patent [19]
Ashar et al.

[11] Patent Number: 6,163,876
[45] Date of Patent: Dec. 19, 2000

[54] METHOD FOR VERIFICATION OF RTL GENERATED FROM SCHEDULED BEHAVIOR IN A HIGH-LEVEL SYNTHESIS FLOW

[75] Inventors: Pranav Ashar, Princeton; Subhrajit Bhattacharya; Anand Raghunathan, both of Plainsboro, all of N.J.; Akira Mukaiyama, Tokyo, Japan

[73] Assignee: NEC USA, Inc., Princeton, N.J.

[21] Appl. No.: 09/187,927

[22] Filed: Nov. 6, 1998

[51] Int. Cl.$^7$ .................................................... Q06F 17/50
[52] U.S. Cl. .................................. 716/5; 703/15; 716/1; 716/4; 716/5; 716/12
[58] Field of Search .................................. 703/15; 716/1, 716/4, 5, 12

[56] References Cited

U.S. PATENT DOCUMENTS

| | | | |
|---|---|---|---|
| 5,493,508 | 2/1996 | Dangelo et al. | 716/5 |
| 5,557,531 | 9/1996 | Rostoker et al. | 716/1 |
| 5,712,791 | 1/1998 | Lauterbach | 716/4 |
| 5,933,356 | 8/1999 | Rostoker et al. | 703/15 |
| 5,956,257 | 9/1999 | Ginetti et al. | 716/12 |

OTHER PUBLICATIONS

Brand, D. "Verifciation of Large Synthesized Designs", IEEE Conference on Computer–Aided Designs, 1993, pp. 534–537.

Bryant, R.E., "Graph Based Algorithms for Boolean Function Manipulation", IEEE Trans. Comp., vol. C–35, pp. 677–691, Aug. 1986.

Brace, et al, "Efficient Implementation of BDD Package", IEEE Design Automation Conference, pp. 40–45, 1990.

Monahan, et al, "Symbolic Modeling and Evaluation of Data Paths", IEEE Design Automation Conference, pp. 80–85, 1995.

Pawlovsky, et al, "Verification of Register Transfer Level (RTL) Designs", IEEE International Conference, pp. 91–94, 1989.

Vakilotojar, et al, "RTL Verification of Timed Asynchronous and Heterogeneous Systems using Symbolic Model Checking", IEEE Design Automation Conference, pp. 181–188, 1997.

Jerry R. Burch, Member, IEEE, Edmund M. Clarke, Member, IEEE, David E. Long, Member, IEEEE, Kenneth L. McMillan, and David L. Dill, Member, IEEEE, "Symbolic Model Checking for Sequential Circuit Verification".

Karl S. Brace et al., "Efficient Implementation of a BDD Package".

(List continued on next page.)

Primary Examiner—Paul R. Lintz
Assistant Examiner—Jibreel Speight
Attorney, Agent, or Firm—Sughrue, Mion, Zinn, Macpeak & Seas, PLLC

[57] ABSTRACT

A complete procedure for verifying register-transfer logic against its scheduled behavior in a high-level synthesis environment is provided. A new method that is both complete and practical for verification is provided. Hardware verification is known to be a hard problem and the proposed verification technique leverages off the fact that high-level synthesis—performed manually or by means of high-level synthesis software—proceeds from the algorithmic description of the design to structural RTL through a sequence of very well defined steps, each limited in its scope. Equivalence checking task is partitioned into two simpler subtasks, verifying the validity of register sharing, and verifying correct synthesis of the RYL interconnect and control. While state space traversal is unavoidable for verifying validity of the register sharing, irrelevant portions of the design are automatically abstracted out, significantly simplifying the task that must be performed by a back-end model checker.

8 Claims, 6 Drawing Sheets

OTHER PUBLICATIONS

Joao P. Marques Silva et al., "GRASP–A New Search Algorighm for Satisfiability".

Daniel Brand, "Verification of Large Synthesized Designs".

Wolfgang Kunz, "Hannibal: An Efficient Tool for Logic Verification Based on Recursive Learning".

Rajarshi Mukherjee, "Veriful: VERIfication using FUnctional Learning".

Design, Automation and Test in Europe, "The Unified European Event," Conference 1998, Abstract.

Reinaldo A. Bergamaschi, "Observable Time Windows: Verifying High–Level Synthesis Results".

Shin–ichi Minato, "Generaation of BDDs from Hardware Algorithm Descriptions".

Rajeev Alur, Thomas A. Henzinger, Lecture Notes in Computer Science, "Computer Aided Verification".

J. Seikmann, G. Goos and J. Hartmanis, Lecture Notes in Artificial Intelligence.

Kwang–Ting Cheng et al., "Automatic Functional Test Generation Using The Extended Finite State Machine Model".

Farzan Fallah, et al., "Functional Vector Generation for HDL models Using Linear Programming and 3–Satisfiability".

James H. Kukula, et al., "Techniques for Implicit State Enumeration of EFSMs".

E. M. Clarke, et al., "Word Level Model Checking—Avoiding the Pentium FDIV Error".

Chuck Monahan and Forrest Brewer, "Symbolic Modeling and Evaluation of Data Paths".

Randal E. Bryant, "Graph–Based Algorithms for Boolean Function Manipulation".

```
Procedure DFS.CSG(op_k, x_1)
    if (gset(op_k, x_1) ≠ ∅) {
        op_k ->mark :+0;}
        return NOTMARKED; }
    if (uset(op_k, x_1) ≠ ∅) {
        op_k ->mark := 1;
        return MARKED; }
    for all successors op_j of op_k {
        if (DFS.CSG(op_j, x) == MARKED) {
            op_k ->mark := 1;
            return MARKED; }}
```

FIG. 3

```
Procedure CHECK_REG_MAPPING(SchedG, RegMapping)
  opset := all op_n with gen(x_1), |M_1| > 1
  for each op_n in opset {
    DFS.CSG(op_n, x_1);
    DFS.RG(op_n);
    CG := Extract_Marked_Nodes(SchedG);
    PG := Prune_SubGraph(CG, op_n);
    if (Benign_Mapping(PG, op_n) ≠ TRUE)
        Declare mapping to be invalid.
  }
  Declare mapping to be valid.
```

```
Procedure COMPARE_STRUCTURE_GRAPHS(RSG, SSG₁)
  Arr1 := DFS_SORT(SSG₁)
  Arr2 := DFS_SORT(RSG)
  Identify basis variables in SSG₁;
  Symbolic simulate SSG₁ to express non-basis vars in
    terms of basis vars;
  Construct equivalence lists for IN nodes in RSG;
  For_each_element(Arr2,v) {
    switch(TYPE(v)) {
    case Mux;
      For each data input vfanin of v {
        For each entry (u,c) in equivalence list of vfanin
          ADD_EQUIVALENCE(v, u, c ∪ select_cond);
      }
    case OP;
      For each pair of entries in equivalence lists of inputs {
        cond = conjunction of conditions;
        if cond ≠ 0 {
          identify corresponding OP vertex uop in SSG₁;
          ADD_EQUIVALENCE(v, uop, cond); }
      }
    case LOGIC;
      convert input lists into BDD nodes and propagate,
    case PO;
      If equivalence exists with corresponding PO in SSG₁
      and condition is 1
        continue;
      else
        return(Error);
    }
  }
  return(Equivalent);
```

FIG. 6

METHOD FOR VERIFICATION OF RTL GENERATED FROM SCHEDULED BEHAVIOR IN A HIGH-LEVEL SYNTHESIS FLOW

DESCRIPTION OF THE INVENTION

IA. Field of the Invention

This invention relates to validation of a structural register transfer logic implementation against a higher level initial description. More specifically, this invention relates to techniques for verification of a register-transfer logic against its scheduled behavior in a high-level synthesis environment. The invention is embodied in a verification procedure that is both complete and practical.

IB. Background of the Invention

Design validation is widely recognized as a key element of the synthesis process, and the cost of detecting bugs at a late stage in the design process is well documented thanks to a number of widely publicized instances. The increasing use of automated tools for synthesis has increased the need for more advanced validation techniques rather than the other way around. To begin with, synthesis tools are complex pieces of software and are impossible to certify as being bug free. In addition, the increased productivity that comes with the use of synthesis software has meant that it is possible for designers to churn out larger designs in a shorter time frame. A side effect of the use of synthesis software has also been that designers have increasingly less knowledge of the internal details of the design. All this has meant that validation tools must now operate on larger monolithic blocks of the design with less help from the designers, and must complete the task faster than before. The onus is clearly on validation tools to ensure that design validation does not become the factor that impedes growth in design productivity.

It is now well established that simulation by itself cannot be sufficient as a validation strategy since it is time consuming without guaranteeing correctness. It also has the fundamental weakness that it cannot be used to prove liveness properties. See J. R. Burch, E. M. Clarke, D. E. Long, K. L. McMillan, and D. L. Dill, "Symbolic model checking for sequential circuit verification," *IEEE Transactions on Computer-Aided Design*, vol. 13, April 1994. It is believed that simulation will be used in the future in design validation mainly as a preprocessing step to detect egregious bugs up front in the design process. The final proof of correctness must be provided by formal techniques that employ efficient means of rapidly evaluating all possible behaviors of the design. Given that establishing the correctness of a design is an extremely hard problem, such formal techniques must use knowledge of the synthesis process and of structural aspects of the design in order to be viable.

Viable techniques have become available over the last half decade for establishing the equivalence between designs at the structural level with a number of tools now offered by EDA companies like Chrysalis and Synopsys for that purpose. While advances in Binary Decision Diagram (BDD) technology and satisfiability checking based ATPG algorithms have contributed to this development, the major impact has been due to the exploitation of the structural properties of the designs being validated. See K. S. Brace, R. L. Rudell, and R. E. Bryant, "Efficient implementation of a BDD package," in *Proc. Design Automation Conf.*, pp. 40–45, June 1990; and J. P. M. Silva and K. A. Sakallah, "Grasp: A new search algorithm for satisfiability," *Proc. Int. Conf. Computer-Aided Design*, November 1996. Basically, these equivalence checking tools rely on the fact that in spite of all the optimizations performed by synthesis tools at the structural level, there is a large amount of correspondence between internal nets of the netlists being compared. Recent research has shown that exploiting such correspondence allows very large netlists to be checked formally with existing BDD and ATPG based techniques. See D. Brand, "Verification of large synthesized designs," *Proc. Int. Conf. Computer-Aided Design*, pp. 534–537, November 1993; W. Kunz, "HANNIBAL: an efficient tool for logic verification based on recursive learning," *Proc. Int. Conf. Computer-Aided Design*, pp. 538–543, November 1993; and J. Jain, R. Mukherjee, and M. Fujita, "Advanced verification techniques based on learning," in *Proc. Design Automation Conf.*, June 1995.

The emergence of formal equivalence checking tools at the structural level has coincided nicely with the increasing use of structural Register Transfer Level (RTL) descriptions as the starting point of the design process followed by synthesis tools like the Design Compiler from Synopsys. The trend for the future is for designers to start their designs with design descriptions more abstract than structural RTL. The ultimate focus of the present invention is to provide methodologies and tools for equivalence checking between structural RTL and their more abstract higher level initial descriptions. These techniques must also exploit knowledge of circuit properties and the synthesis flow to be viable.

Various efforts in the verification of designs generated from high-level descriptions have been described in the following references: J. Gong, C. T. Chen, and K. Kucukcakar, "Multi-dimensional rule checking for high-level design verification," *Proc. Int. High-level Design Validation & Test Wkshp.*, November 1997; R. A. Bergamaschi and S. Raje, "Observable time windows: Verifying high-level synthesis results," *IEEE Design & Test of Computers*, vol. 8, pp. 40–50, April 1997; and S. Minato, "Generation of BDDs from hardware algorithm descriptions," *Proc. Int. Conf. Computer-Aided Design*, pp. 644–649, November 1996. Without going into the details of these methods, it should suffice to say that these methods are either not complete or do not derive any efficiency out of their knowledge of the high-level synthesis domain, limiting their applicability. Similarly, technologies like symbolic model checking, language containment, theorem proving, techniques for modeling arithmetic in the verification context are extremely powerful but must be applied wisely and in the proper context to be effective. See J. R. Burch, E. M. Clarke, D. E. Long, K. L. McMillan, and D. L. Dill, "Symbolic model checking for sequential circuit verification," *IEEE Transactions on Computer-Aided Design*, vol. 13, April 1994; R. K. Brayton et al., "VIS: A system for verification and synthesis," *Proc. Int. Conf. Computer-Aided Verification*, July 1996; S. Owre, J. M. Rushby, and N. Shankar, "PVS: A prototype verification system," 11*th International Conference on Automated Deduction* (D. Kapur, ed.), vol. 607 of *Lecture Notes in Artificial Intelligence*, Springer Verlag, 1992; K. T. Cheng and A. S. Krishnakumar, "Automatic functional test generation using the extended finite state machine model," *Proc. Design Automation Conf.*, June 1993; F. Fallah, S. Devadas, and K. Keutzer, "Functional vector generation for HDL models using linear programming and 3-satisfiability," Proc. Design Automation Conf., June 1998; J. Kukula, T. Shiple, and A. Aziz, "Implicit state enumeration for FSMs with datapaths," Tech. Rep., Synopsys, October 1997; and R. P. Kurshan, Computer-Aided Verification of Coordinating Processes: The Automata-Theoretic Approach, Princeton University Press, 1995. Accordingly, the prior art has failed to provide complete and practical techniques for verification of a register-transfer logic against its scheduled behavior in a high-level synthesis environment.

SUMMARY OF THE INVENTION

It is therefore an objective of this invention to provide a complete and practical method for verification of a register-transfer logic against its scheduled behavior in a high-level synthesis environment.

Specifically it is an object of this invention to provide a method for verification of a structural register-transfer level implementation of a scheduled behavioral specification.

To achieve the objects of this invention there is provided a method of specification for verification of a structural register-transfer level implementation of a scheduled behavioral, said method comprising the steps of verifying the validity of register sharing and checking intra-cycle equivalence.

Further improvements include the above method wherein the step of verifying validity of register sharing further comprises substeps of identifying graph formed by a plurality of paths along which gen-use conflicts occur and verifying the benignness of each of said gen-use conflicts.

Still further improvements include the above method wherein paths along which said gen-use conflicts occur are identified using depth-first search procedure.

Still further improvements include the above method wherein the benignness of each of said gen-use conflicts is verified by testing falsity of all the paths from said graph.

Still further improvements include the above method wherein the step of verifying the validity of register sharing further comprises a step of checking for any register $R_i$ in the implementation the validity of a condition whether either the corresponding set $M_i$ has only one element, or $M_i$ has multiple elements, but all conflicting gen-use pairs for said register are benign.

Another aspect of the invention is a method a method of simulation for checking equivalence of a schedule structure graph (SSG) and an RTL structure graph (RSG) comprising: creating ordered sets of nodes Arr1 corresponding to SSG and Arr2 corresponding to RSG such that each node appears only after all corresponding nodes in a transitive fanin of said each node appear; identifying base variables in SSG as outputs of one of primary input (PI), operator (OP) and multiplexer (MUX) nodes; traversing through Arr1 for each node whose output does not correspond to said base variables to obtain binary decision diagrams (BDDs) of outputs based on BDDs of inputs; associating each node in RSG with an equivalence list, said equivalence list representing a conditional equivalence relationship between outputs of said each node and signals in SSG, wherein an entry in said equivalence list is pair (u,c), wherein u is an identifier for a signal in SSG and c is a BDD representing conditions for equivalence; traversing Arr2 and processing each node in Arr2 to propagate equivalence lists from inputs of said each node to outputs of said each node; checking to see if an equivalence has been established with corresponding OUT node in SSG and if corresponding condition is a tautology, said checking being performed when a primary output (PO) node of RSG is reached; declaring RSG and SSG to be equivalent if all OUT nodes of RSG are unconditionally equivalent; and declaring RSG and SSG to be not equivalent if at least one OUT node of RSG is not unconditionally equivalent.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

One of the objects of the present invention is to develop a strategy for structural RTL validation in which the equivalence between structural RTL and its most abstract initial description is established by proving the equivalence between the initial and final descriptions at each synthesis step. As in the case of formal equivalence checking tools at the purely structural level, the assumptions must be made about the scope of each synthesis step and the properties of the synthesized designs. The basic assumption is that synthesis proceeds in the well defined steps of algorithmic transformations, followed by scheduling, finally followed by structural RTL synthesis. Taking a bottom up approach, the first step has been taken towards developing an equivalence checking procedure for the validation of structural RTL against scheduled behavior which we equivalently call functional RTL. This is the object of the present invention.

At the level of scheduled behavior, each data path operation is clearly associated with the state in which it will be executed. The transition between states as a function of the present state, primary inputs and the results of data path operations is also clearly defined. What is not defined is the association of variables with registers, and the actual circuit implementation of the control/data flow in each state. The assignment of registers to variables (with registers possibly being shared among variables), the generation of hardware to enable the register assignment and sharing, and the generation of hardware to enable the sharing of functional blocks among data path operations are exactly the synthesis steps performed in the generation of structural RTL from scheduled behavior. The invention provides algorithms which can be used to check the correctness of these synthesis steps applied to scheduled behavior. The algorithms according to the present invention are novel in that they are tuned specifically to the synthesis steps that they are supposed to check. That is what makes them practical without sacrificing completeness.

In essence, the algorithms according to the present invention are based on the observation that the state space explosion in most designs is caused by the data-path registers rather than the number of control states. Given the clear delineation between data-path and control in the high-level synthesis environment, the present invention divides the equivalence checking task into the checking of (1) local properties which are checked on a per control state basis, and (2) non-local properties which require a traversal of the control state space. The non-local properties are checked in the following manner: A number of assertions are generated for each non-local property such that checking all the assertions is equivalent to checking the non-local property. Each assertion is then checked separately on a model of the design relevant to the assertion being checked, with the rest of the design abstracted out. A number of model checking tools can be used for this purpose. See J. R. Burch, E. M. Clarke, D. E. Long, K. L. McMillan, and D. L. Dill, "Symbolic model checking for sequential circuit verification," *IEEE Transactions on Computer-Aided Design*, vol. 13, April 1994; R. K. Brayton et al., "VIS: A system for verification and synthesis," *Proc. Int. Conf. Computer-Aided Verification*, July 1996; and E. Clarke, M. Khaira, and X. Zhao, "Word level symbolic model checking—a new approach for verifying arithmetic circuits," *Proc. Design Automation Conf.*, June 1996. The abstraction of the design for the assertion being checked is key. Again, this is made possible by the clear delineation between data-path and control and the small number of control states.

An algorithm to verify the correctness of a structural register-transfer level (RTL) implementation of a scheduled behavioral specification or schedule according to the present invention will be described below. First, the verification problem that the present invention solves will be defined. Then, it will be proven that the implementation is equivalent to the specification if two key properties can be verified. The two properties, the valid register sharing property, and the intra cycle equivalence property, thus partition a complex verification problem into two simpler subproblems. The problem formulation and the two properties are discussed below. Algorithms for checking the two properties according to the present invention are also presented.

Problem Formulation and Partitioning

First, the RTL specification is defined. An RTL specification can be defined in terms of variables V, operations O, and clocks, the clocks governing the updating of the value of variables. Variables are divided into 4 sets V (PI, PO, R, T). PI is the set of primary inputs, PO is the set of primary outputs, R is the set of register variables, and T is the set of temporary variables. Operations are categorized into two types O=(C, A), C being the set of control operations, and A being the set of assignment operations. The result of a control operation is boolean, and the results are used to control execution of other operations. Assignment operations assign to and change value of variables. Every operation $op_i$ has a corresponding condition $c_i$ associated with it. The condition $c_i$ is a logical expression and may be composed using the results of other assignment and control operations. The operation $op_i$ is executed only if $c_i$ is true. The definition holds for functional RTL specifications, such as the schedule in FIG. 1, as well as for structural RTL specifications, such as the RTL circuit in FIG. 6.

The updating of values of variables is controlled by the clock. The clock splits time into discrete integral values starting at time t=0, with t being incremented by 1 at every clock tick. At time t=0, some register variables are initialized. The value of a register variable at any given time t=T, t>0, is fixed and independent of operations taking place at that time. If a register variable is assigned a value at t=T, the register variable assumes the value at t=T+1. If no assignment is made to a register variable at t=T, it retains its value from t=T−1. The value of a temporary variable or primary output is defined at t=T only if an assignment is made to it at that time. Primary inputs are not assigned to and can only be used as inputs for an operation.

Figure 1A:
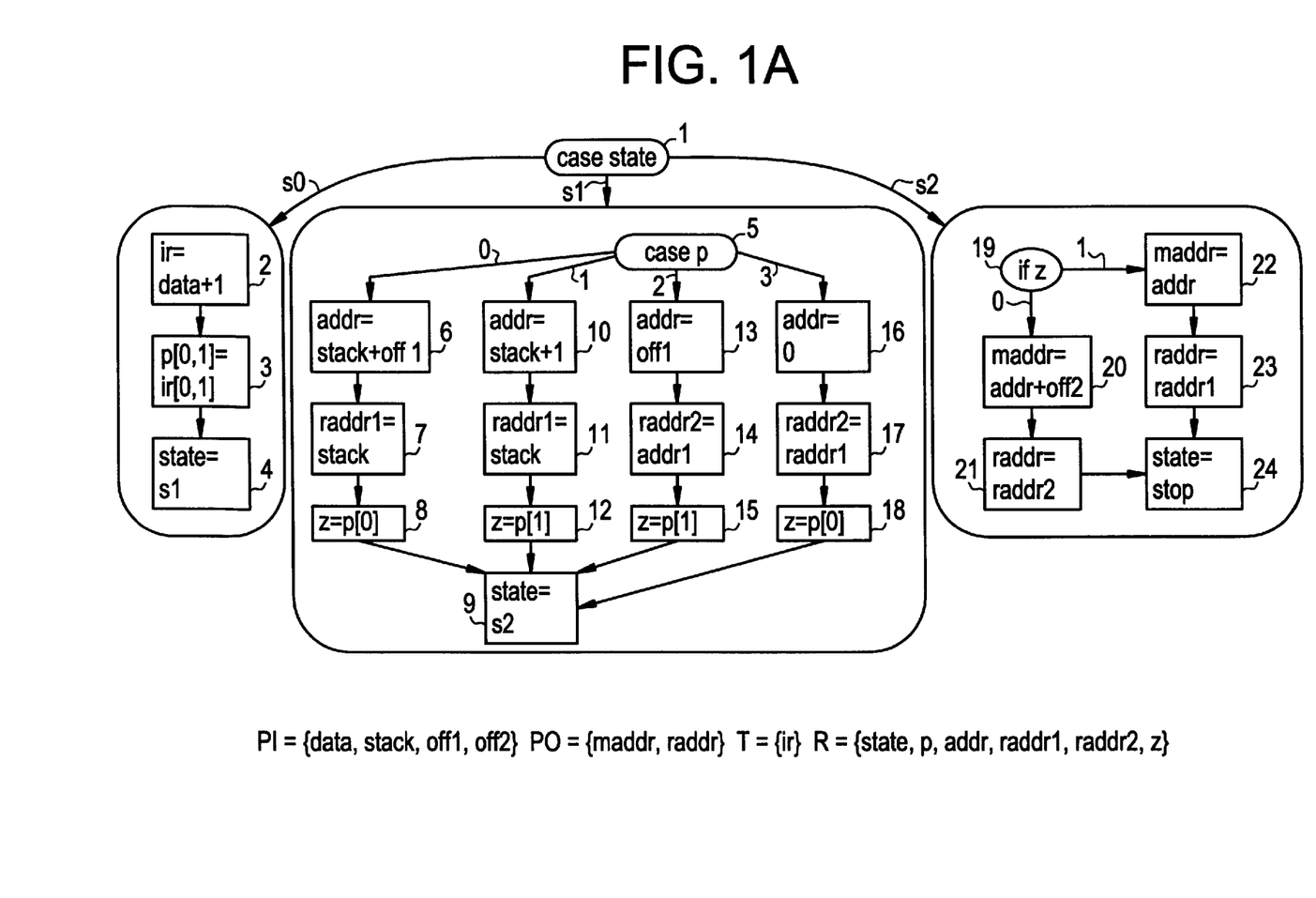
FIG. 1(a) illustrates the schedule of the behavioral description.

Schedules of a behavioral specifications have some additional properties. The schedule consists of a distinguished register variable called the state variable. The state variable can attain a fixed set of known values. A state of the schedule corresponds to a particular value of the state variable. It is assumed that at t=0, the state variable is initialized to $s_0$. The initialization is not shown in FIG. 1(*a*). Corresponding to each state, there is a set of next state operations which assigns a constant value from the known set of values to the state variable. If the schedule is in a particular state at time t=T, the next state operations define the possible values of the state variable at time t=T+1. Depending upon the conditions, only one of the next state operations is executed at any time. For each state of the schedule, there is a set of operations which are conditionally executed only in the state they belong to. Thus, the condition for execution of $op_6$ is $c_6$=(state==$s_1$) AND (p==0).

The schedule specification properties, Property 1, and the properties of the RTL synthesis procedure, Property 2, stated next are important for verification algorithms according to the present invention to work successfully.

Property 1

Specification

The following properties are for any RTL specification.

1. It is assumed that at any time, only one assignment can be made to a variable.
2. If any register variable is used in an operation at t=T, T>0, then it must have been initialized or assigned at some time t<T. Note that at t=0, none of the register carry a valid value due to initialization, since if a register is assigned a value at t=T, it contains the value only at t=T+1. Thus, none of the operations at t=0 can use a register operand, and can use only primary inputs.

Property 2

Transformation Invariants

The following properties are assumed for an RTL implementation synthesized from an RTL specification.

1. There is a 1 to 1 mapping between INPUTS and OUTPUTS in the two representations.
2. There is a many to one mapping from the variables in the set R of the specification and the variables in the set R of the implementation. Let $R_i$ be a register variable in the implementation, and $M_i$ be the set of register variables of the specification which have been mapped to $R_i$. If $M_i$ has more than one element, it is said that $R_i$ is being shared. For ease of explanation, if a variable x belongs to $M_i$, it will be simply renamed $x_i$.
3. If a register variable in the specification is initialized with a value at t=0, the corresponding register variable in the implementation must have the same value at t=0. If a set of variables share a register, only one variable in the set may be initialized at t=0.

Problem Statement

Given a functional RTL specification and a structural RTL specification which satisfies Property 1 and Property 2, verify that at any time t=T, if an output variable of the specification is assigned a value, the same value is assigned to the corresponding output variable of the implementation.

Next, two properties are presented, Property 3 and Property 4, and proved in Lemma 1 that if the two properties are satisfied by the implementation, then the implementation's outputs are assigned the same values as the corresponding outputs of the specification, as is required by the problem statement.

Definition 1

Path in Schedule

It is said that there is a path in a schedule from state $s_i$ to $s_j$, if there are next state transitions which can change the state from $s_i$ to $S_j$.

Definition 2

Conflicting Gen-Use Pair

Let two specification variables $x_i$ and $y_i$, $x_i y_i$, be mapped to the same register $R_i$ in the implementation. Let operation $op_m$ in state $s_j$ generate $x_i$ and operation $op_n$ use $y_i$ in state $s_k$, the two operations being executed in different clock cycles, and there is a path P from state $s_j$ to $s_k$ such that no assignment to $R_i$ takes place in any of the states between $s_j$ and $s_k$. Then it is said that the operation pair $op_m$ and $op_n$ is a conflicting gen-use pair for register $R_i$ along P.

Definition 3

Benign Gen-Use Conflict

Let there be a conflicting gen-use pair $op_m$ in state $s_j$ and $op_n$ in state $s_k$ along path P". Let there be a path P' from $s_0$ to $s_1$. For the path P' followed by P", let state=$s_j$ at t=$T_1$ and state=$s_k$ at t=T2. Then when the sequence of transitions in P' is executed followed by the sequence of transitions in P", if either $c_m$ is FALSE at t=T1 or $c_m$ is FALSE at t=T2, the gen-use conflict is said to be benign.

Property 3

Valid Register Mapping

An implementation is said to satisfy the valid register mapping property if for any register $R_i$ in the implementation, either the corresponding set $M_i$ has only one element, or $M_i$ has multiple elements, but all conflicting gen-use pairs for such registers are benign.

Figure 6:
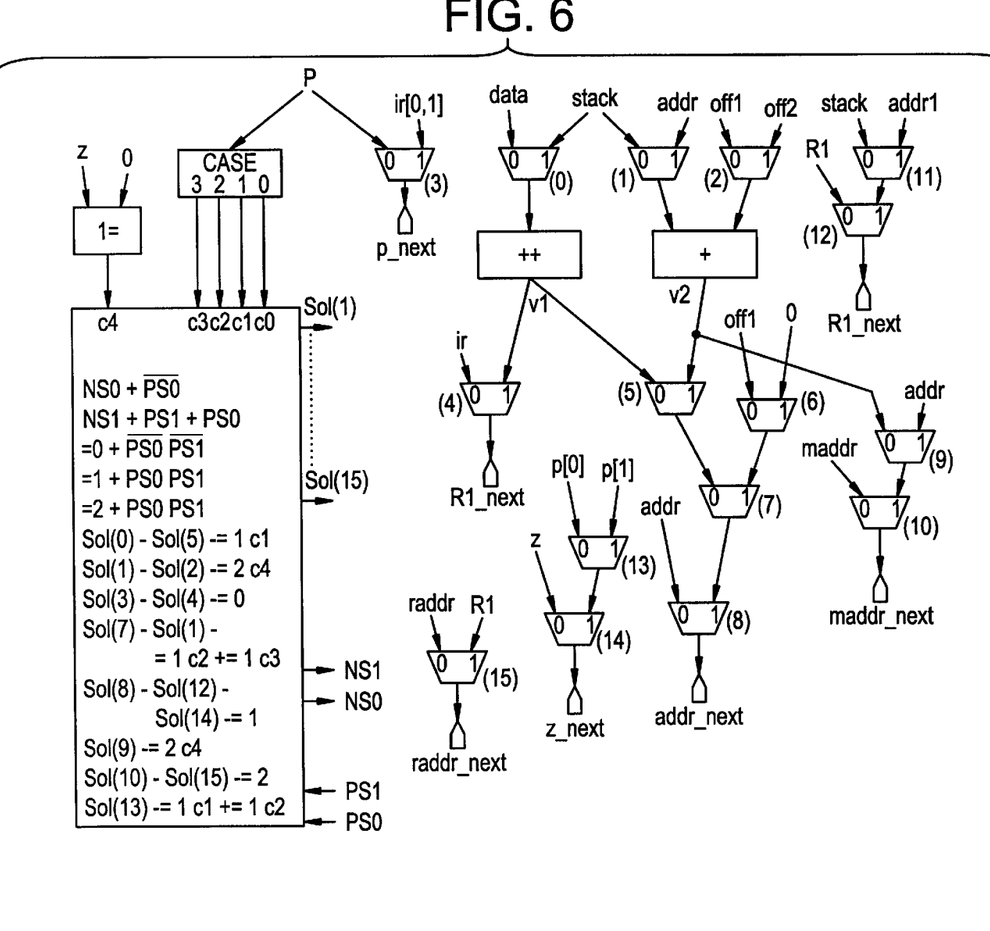
FIG. 6 illustrates structure graph for RTL implementation of the schedule shown in FIG. 1(a).

The structural RTL circuit of FIG. 6 which is an implementation of the schedule of FIG. 1(a) shares register $R_1$ amongst specification variables raddr1 and raddr2. Hence, $M_1=\{raddr1_1, raddr2_1\}$. Since $raddr1_1$ is assigned by operation $op_7$ in state $s_1$ and $raddr2_1$ is used by operation $op_{21}$ in state $s_2$ and there is a state transition from $s_1$ to $s_2$ there is a possible conflicting gen-use pair. However, as we will show later, execution of $op_7$ is never followed by execution of $op_{21}$ in a subsequent cycle due to the existence of a false path. Thus, the conflicting gen-use pair for $R_1$ is actually benign.

Definition 4

Operation Modulus Using Register Mapping

An operation in the specification modulus the register mapping is another operation derived from the specification operation by replacing all operands $x_i$ which are register variables with the corresponding registers $R_i$ to which the variables have been mapped in the implementation.

As an example, consider operation $op_7$ in FIG. 1. Assume that in the implementation of FIG. 6 variables stack, and raddr1 are mapped to registers $R_{stack}$ and $R_1$. Thus $op_7$ which is raddr1:=stack modulus the register mapping is $R_1:=R_{stack}$.

Property 4

Intra-Cycle Equivalence Property

An implementation is said to satisfy the intra-cycle equivalence property if, at any time $t \geq 0$, the set of assignment operations executed in the specification modulus the register tapping is the same as the set of assignment operations performed in the implementation.

Definition 5

Variable Contained in Register

For an implementation register $R_i$, and the corresponding set $M_i$, the variable contained in $R_i$ is an element of $M_i$. For a sequence of operations from time t=0 until t=T, different elements of $M_i$ may have been assigned at different times t, t<T. For the given operation sequence, the element of $M_i$ assigned for the largest t, t<T, is defined to be contained in $R_i$ at t=T.

Consider again FIG. 1. As stated before but not shown in the figure, at t=0, the state variable is initialized to $s_0$. If operations $op_1 \ldots op_4$ are executed at t=1, and operations $op_5, op_6, \ldots op_9$ at t=2, then $R_1$ contains $raddr1_1$ at t=3. If operations $op_5, op_{13}, \ldots, op_{15}, op_9$ are executed at t=2, then $R_1$ contains $raddr2_1$ at t=3.

Lemma 1

For an implementation of a schedule specification and a register mapping which satisfies Property 3 and Property 4, at t=T, T>0, if $R_i$ contains $x_i$, then $R_i$ contains the correct value of $x_i$, that is, $R_i$ contains the same value as the value of $x_i$ in the schedule specification at t=T.

Proof

The lemma will be proven by induction.

Basis Step, t=1

At t=1, consider any register $R_i$ which contains $x_i$. At t=0, $x_i$ must have been initialized by an assignment operation. By property 4, the operation which assigns to $x_i$ at t=0 modulus the register mapping is the same as the operation which assigns to $R_i$ at t=0. From the specification properties Property 1, all the variables used in an operation at t=0 must have been primary inputs, and from the invariant properties, Property 2, since there is one to one correspondence between input variables in the specification and implementation, $R_i$, must contain the correct value of $x_i$.

Induction Step, t=T+1, T>0

It is assumed that the statement of Lemma 1 is true for t=T. Also assumed is that at t=T, variable $y_j$ was one of the variables assigned as a result of an operation, $y_j <= f(w_k, \ldots )$ in the specification. By property 4, $R_j <= f(R_k, \ldots )$. According to Definition 5, $R_j$ contains $y_j$ at t=T+1. It will be proven that $R_j$ contains the correct value of $Y_j$ at t=T+1.

First, it will be shown that $R_k$ contains $w_k$ at t=T. Suppose $R_k$ contains some variable $u_k$, at t=T, $u_k \neq w_k$. That implies that of all the elements in $M_k$, $u_k$ was the last one to be assigned for some t<T. Also, from above, it is known that $w_k$ is used by the operation $f(w_k, \ldots )$ at t=T, thus violating Property 3. So $R_k$ must contain $w_k$ at t=T. Thus, from the induction argument, $R_k$ must contain the correct value of $w_k$ at t=T. Hence, $R_j$ also contains the correct value of $y_j$ at t=T+1.

Theorem 1

If an implementation of a specification satisfies Properties 3 and 4, then if at any time t=T, an output variable of the specification is assigned a value, the same value is assigned to the corresponding output variable of the implementation.

Proof

If an output variable is assigned at t=0, it must be assigned from an input variable. Since it is stated in the transformation invariants of Property 2 that inputs in the specification and implementation correspond to each other, the output values must also be the same at t=0.

Let the output variable of the specification be assigned as $O_i <= f(x_j, \ldots )$ at t=T, T>0. By Property 4, in the implementation the operation $O_i <= f(R_j, \ldots )$ is executed. As in the proof of Lemma 1, it can be shown that $R_j$ contains the correct value of $x_j$. Hence, $O_i$ for the implementation should be assigned the same value as $O_i$ for the specification.

In the next two sections, Section 2.2 and Section 2.4, algorithms for verifying Property 3 and Property 4 are discussed. These two algorithms combined will provide a complete algorithm for verifying that the implementation of a specification is correct as required by the problem statement presented earlier in this section.

Algorithm for Verifying Validity of Register Sharing

In this section, an algorithm for verifying the validity of register mapping for schedules of behavioral descriptions will be presented. Definitions 2, and 3 and the statement in Property 3 form the basis of the algorithm.

Figure 2:
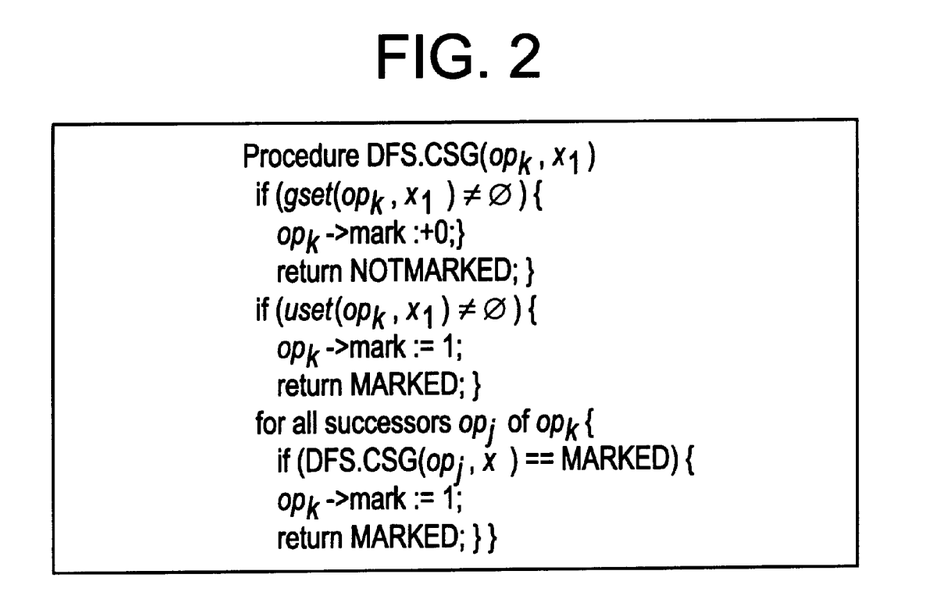
FIG. 2 illustrates algorithm for identifying subgraph with paths containing conflicting gen-use pairs.

The first step involves identifying paths along which conflicting gen-use pairs occur, as defined in Definition 2. Suppose an operation node $op_n$ is a gen node for a variable $x_i$, and $M_i$ has more than 1 element. There may be many paths along which conflicts arise involving $op_n$. Instead of enumerating each path separately, a conflict subgraph CSG is identified which contains all the conflicting paths involving $op_n$. The procedure for identifying CSG is a constrained depth-first search (DFS), DFS_CSG, as given in FIG. 2. Let uset $(op_n, x_i) = \{y_i | y_i \neq x_i, y_i \epsilon M_i, y_i$ input $op_n\}$, and gset $(op_n, x_i) = \{y_i | y_i \epsilon M_i, y_i$ assigned by $op_n\}$. Let $op_k$ be a node visited during the forward traversal phase of the DFS. If gset for $op_k$ is not empty, an assignment is being made to $R_i$ in $op_k$. Since this violates the condition for a conflicting gen-use pair, node $op_k$ can not be on a conflicting path. Thus, the DFS routine does not mark the node and returns with the value NOTMARKED. If uset is not empty, then a conflicting use operation has been identified and DFS marks the node as a CSG node and returns the value MARKED. If neither of the above conditions hold, then the DFS marks the node $op_k$ only if one of its successors returns MARKED.

To verify that the gen-use conflicts are benign, as per definition 3, the reachability subgraph RG containing paths from the start state of the schedule to $op_n$ is identified, and is added to the CSG subgraph to form the conflict graph CG. Let there be a path $(op_0, \ldots, op_{i1}, \ldots, op_{i2}, \ldots, op_{i3}, \ldots, op_{i4})$ Let $op_{i1}, op_{i2}$ and $op_{i3}, op_{i4}$ be two conflicting gen-use pairs. It is sufficient to prove that the path segment $(op_0, \ldots, op_{i1}, \ldots, op_{i2})$ is false, since it implies that the complete path must be false. Since the CSG already consists of paths with a conflicting gen-use pair for a given shared register, when generating the RG, paths which contain a conflicting gen-use pair for the same register are not included. The reachability subgraph RG is identified with another constrained DFS routine, DFS_RG, details of which are omitted. The procedure Extract_Marked_Nodes identifies nodes marked by DFS.CSG and DFS_RG, and adds the marked nodes and edges between the marked nodes to create the CG.

Figure 1B:
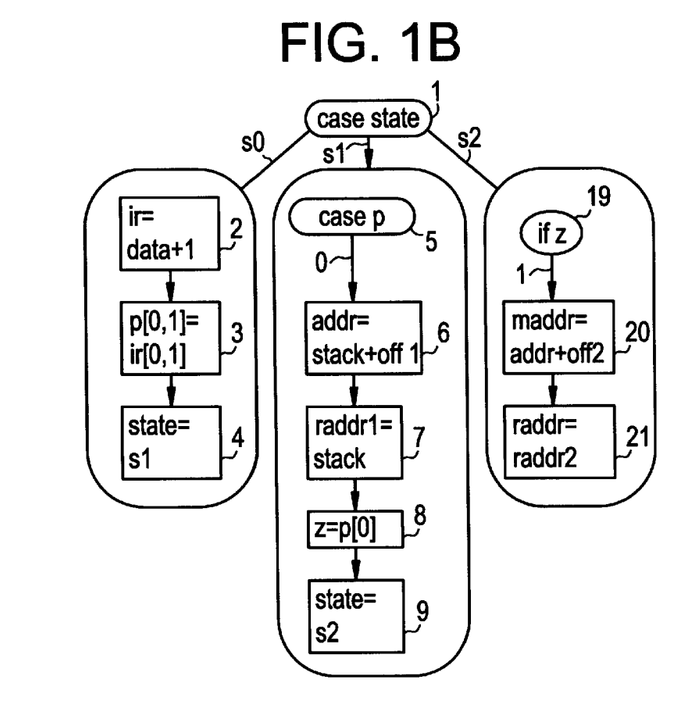
FIG. 1(b) shows subgraph containing conflicting gen-use pair, $op_{13}$ and $op_7$.

Consider the schedule shown in FIG. 1(a) and the mapping of its variables raddr$1_1$ and raddr$2_1$ to register $R_1$. There are several gen-use conflicts for register $R_1$. One conflicting pair is given by $op_7$ which assigns to raddr$1_1$ and $op_{21}$ which reads raddr$2_1$. The CSG consisting of paths with conflicting gen-use operations involving raddr$1_1$ in $op_7$ includes the following operations $(op_6, op_7, op_8, op_9, op_{19}, op_{20}, op_{21})$ and edges between the operations, while the corresponding RG consists of operations $(op_1, op_2, op_3, op_4, op_5)$ and edges between them. The CG which is a union of the CSG and RG is shown in FIG. 1(b).

Figure 1C:
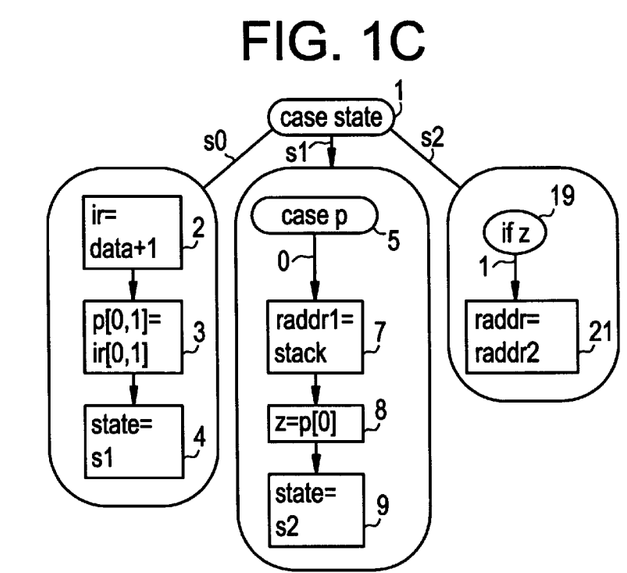
FIG. 1(c) shows subgraph derived from FIG. 1(b) after removing operations not essential for proving whether the gen-use pair is benign or not.

To prove that a gen-use conflict is benign, it is necessary to prove that the paths in the graph CG are false. Thus, the relationships between operations which control the execution of the path such as $op_5$ and $op_9$ in FIG. 1(b) are of primary interest. Any operation which does not affect the control conditions in the CG can be removed from the subgraph, except for the operations which cause the gen-use conflict, thus reducing the size of the subgraph. Consider the subgraph of FIG. 1(b). Since $op_6$ does not affect any conditions in the subgraph, so it can be removed from the subgraph. For the subgraph of FIG. 1(b), the pruned subgraph is shown in FIG. 1(c). The subgraph pruning is implemented by the function Prune_SubGraph. Prune_SubGraph first creates data dependency arcs between CG operations $op_i$ and $op_j$ if the result of $op_i$ is used by $op_j$. Subsequently, a DFS using the data dependency arcs is used to identify all operations which affect the control conditions in CG.

Figure 3:
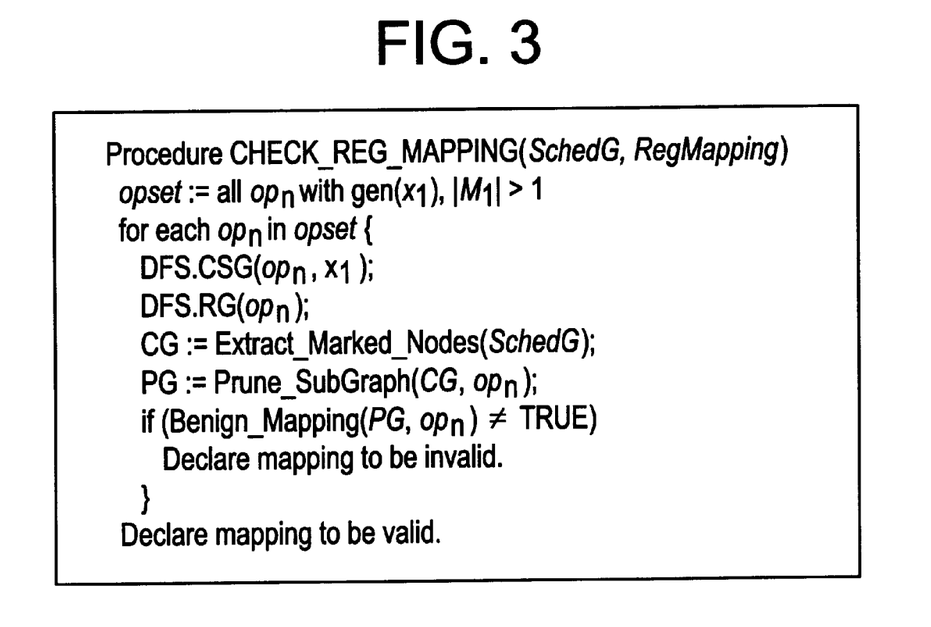
FIG. 3 illustrates algorithm for verifying validity of register mapping.

The pseudo-code for the algorithm verifying the validity of a register mapping is given in FIG. 3.

Verifying the Benignness of a Gen-Use Conflict

The subgraph extracted for each gen-use conflict encapsulates all the paths which must be proved to be unsensitizable (false) for the gen-use conflict to be benign. Doing the analysis by simulation or other means on a path by path basis is obviously not viable given the presence of a large number of paths and loops. The symbolic model checking techniques in Computation Tree Logic (CTL) are used for the purpose. See J. R. Burch, E. M. Clarke, D. E. Long, K. L. McMillan, and D. L. Dill, "Symbolic model checking for sequential circuit verification," *IEEE Transactions on Computer-Aided Design*, vol. 13, April 1994; and R. K. Brayton et al., "VIS: A system for verification and synthesis," in *Proc. Int. Conf. Computer-Aided Verification*, July 1996. Without going into the details of CTL symbolic model checking, suffice to say that it allows to check properties like if some specific event happens in a state, another specific event will never happen in the future.

This is exactly the type of property that is needed to be checked on the subgraph since it needs to be verified that gen is never followed by use. The approach is called symbolic since it effectively builds a single BDD-based representation for the entire state transition relation. The resulting analysis is performed implicitly on all paths together rather than on a path by path basis. To make the symbolic model checking viable, it might be necessary to abstract the bit-width of the arithmetic operations in stone cases. In the future, it will also be possible to avoid this abstraction by using model checking techniques that integrate efficient techniques for modeling arithmetic with symbolic model checking. See E. Clarke, M. Khaira, and X. Zhao, "Word level symbolic model checking—a new approach for verifying arithmetic circuits," *Proc. Design Automation Conf.*, June 1996; J. Kukula, T. Shiple, and A. Aziz, "Implicit state enumeration for FSMs with datapaths," Tech. Rep., Synopsys, October 1997; F. Fallah, S. Devadas, and K. Keutzer, "Functional vector generation for HDL models using linear programming and 3-satisfiability," *Proc. Design Automation Conf.*, June 1998; and K. T. Cheng and A. S. Krishnakumar, "Automatic functional test generation using the extended finite state machine model," *Proc. Design Automation Conf.*, June 1993.

In practice, the subgraph for each gen-use conflict is generated in Verilog syntax. Two additional state variables called gen and use are introduced in the Verilog. Gen and use are set to 1 when their corresponding gen and use events take place. The Verilog code is compiled into the VIS symbolic model checking system. See R. K. Brayton et al., "VIS: A system for verification and synthesis," in *Proc. Int. Conf. Computer-Aided Verification*, July 1996. In VIS, the property AG(gen==1–AG (use==0)) is checked. See R. K. Brayton et al., "VIS: A system for verification and synthesis," *Proc. Int. Conf. Computer-Aided Verification*, July 1996, for description of CTL syntax. The property states that if in any state the variable gen becomes 1, then the variable use must be 0 in all subsequent states.

The major advantage of the present invention is dividing up the task of equivalence checking into the task of checking multiple simple assertions, and by abstracting out the irrelevant portions of the design in checking each assertion. Thus, the task that must be performed by the symbolic model checker is significantly simplified.

Verifying Intra-Cycle Equivalence Between the Schedule and its RTL Implementation The intra-cycle equivalence check is performed state-by-state, i.e., for each state $S_i$ in the schedule, it is proven that the computations performed in $S_i(Sch_i)$ are equivalent to those performed in the RTL implementation in the same state. In doing so, a fact is exploited that while the number of states in the complete RTL (control and data path) circuit can be very large, the number of schedule states (control steps or control states) in scheduled behavioral descriptions is typically limited. The state transition graph (STG) for the schedule is typically explicitly specified by the designer or generated by the scheduling algorithm. It is assumed that the register variable $R_{state}$ in the RTL circuit, corresponding to the schedule state variable State is identified, and that the encoding (mapping of symbolic values of State to Boolean values of $R_{state}$) is known. Without a knowledge of the controller state encoding, the problem becomes significantly more complex and may, in general, require sequential FSM checking techniques.

One approach to establishing the equivalence of RTL and $Sch_i$ could be to obtain gate-level netlists and use BDD or ATPG based equivalence checking techniques (e.g. W. Kunz, "HANNIBAL: an efficient tool for logic verification based on recursive learning," *Proc. Int. Conf. Computer-Aided Design*, pp. 538–543, November 1993). However, these techniques may not be viable for repeated application (for each schedule state) on large designs, especially when they contain a composition of control logic and arithmetic, or when the structural similarity between the netlists is limited as a result of the application of resource sharing.

The present invention provides an alternative approach to checking the equivalence between RTL and $Sch_i$, that exploits the nature of the various transformations that are applied to the schedule in generating the RTL circuit. The typical optimizations that may be performed during this step consist of register and functional unit (operation) sharing, multiplexer generation, and control logic optimization. An important invariant that is preserved by the above optimizations is the atomic nature of word-level operators (including arithmetic operations, comparison operations, etc.).

Figure 4:
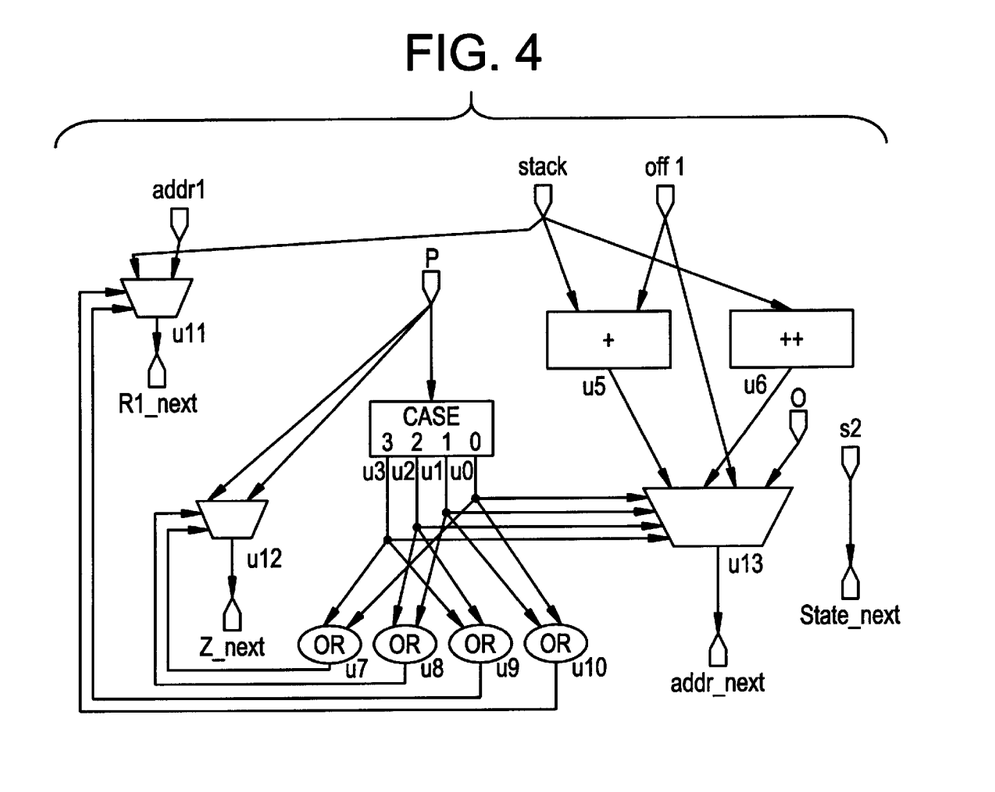
FIG. 4 illustrates structure graph for state $S_2$ in the scheduled behavioral description of FIG. 1.

The equivalence checking technique according to the present invention works at the RT level. First, the set of computations performed in state $S_i$ of the schedule ($Sch_i$) is converted to an equivalent representation called the structure graph, which will be formally defined later. The structure graph corresponding to $Sch_i$ (the RTL circuit) is called $SSG_i$ (RSG). For example, the structure graphs for state s2 of the schedule of FIG. 1(a) and the complete RTL implementation are shown in FIGS. 4 and 6, respectively. It will be verified that $SSG_i$ is equivalent to RSG when the state variable of RSG is set to the encoded value of state $S_i$. The process is repeated for every state of the schedule.

The algorithm for proving equivalence of structure graphs according to the present invention is based on a symbolic simulation based equivalence checking of RSG and $SSG_i$. However, a key difference of the approach according to the present invention from the gate-level combinational equivalence checking approaches is that the former leaves the known-good macro-blocks uninterpreted, thus avoiding reasoning about then or building representations for their functionality. That is achieved by using the notion of conditional equivalence relationships between signals in HSG and SSGI. Similar symbolic simulation approaches were presented in C. Monahan and F. Brewer, "Symbolic modeling and evaluation of data paths," *Proc. Design Automation Conf.*, pp. 389–394, June 1995. See R. Shostak, "An algorithm for reasoning about equality," *Communications of the ACM*, Vol. 21, no. 7, pp.583–585, 1978; R. Jones, D. Dill, and J. Burch, "Efficient validity checking for processor validation," in *Proc. Int. Conf. Computer-Aided Design*, pp. 2–6, November 1995; C. Barrett, D. Dill, and J. Levitt, "Validity checking for combinations of theories with equality," in *Proc. Formal Methods in Computer Aided Design*, pp. 187–201, November 1996; A. Goel, K. Sajid, H. Zhou, A. Aziz, and V. Singhal, "BDD abased procedures for a theory of equality with uninterpreted functions," in *Proc. Int. Conf. Computer-Aided Verifications*, pp. 244–255, July 1998; J. Darringer, "The applications of program verification techniques to hardware verification," in *Proc. Design Automation Conf.*, pp. 375–381, June 1979; and W. Cory, "Symbolic simulation for functional verification with ADLIB and SDL," in *Proc. Design Automation Conf.*, pp. 82–89, June 1981.

The algorithm of the present invention starts with equivalence relationships between input variables. It then propagates equivalence relationships forward through the structure graphs until the outputs are reached, and checks for unconditional equivalence between the output signals of the RSG and $SSG_i$.

The following pre-processing refinements are applied in order to enable the comparison of $Sch_i$ against RTL:

The occurrence of each register variable $x_j$ in $Sch_i$ is replaced with the RTL circuit register variable $R_j$ to which it is mapped. Thus, $Sch_i$ and RTL now use the same set of register variables.

Register variables are re-named when they appear as the target of an assignment operation, in order to distinguish between the present cycle and next cycle values. Whenever a register variable v appears on the left hand side of an assignment, it is renamed to v__next. This is done for both $Sch_i$ and RTL.

The encoding of the symbolic variable State__next is applied to replace State__next in $Sch_i$ with a vector of Boolean variables. All assignments of symbolic state constant values to State__next in $Sch_i$ are replaced with the corresponding constant bit-vectors. This is done to enable comparison of the next-state control logic in the RTL circuit against the state transitions specified in the schedule.

The variable $R_{state}$ in RTL is set to the constant encoded value corresponding to the state under consideration ($S_i$). This is done since only the computations performed by the RTL in state $S_i$ have significance.

The structure graphs will be defined next to represent the computations in the schedule and RTL, and to outline their generation.

Definition 6

Structure Graph

A structure graphic is a directed graph C=(V, A), where the set of vertices V represent hardware components that execute the operations of the specification, and the edges represent the structural connectivity of the components. A vertex v∈V has a type attribute, which may assume the following values: IN (to represent primary input variables and current cycle values of register variables), OUT (to represent primary output variables and next cycle values of register variables), OP (to represent arbitrary word-level operators, including arithmetic operators and comparison operators), LOGIC (to represent the control or random logic), and MUX. The edges in the structure graph are annotated with their bit-widths.

The process of constructing a structure graph from a set of computations is similar to inferring hardware structures from Hardware Description Languages (HDLs). IN and OUT nodes are created to represent primary input and output variables, constant values, and present and next cycle values of register variables. OP nodes are created corresponding to assignment operations that involve word-level computation and conditional operations (e.g. comparison operations, case operation, etc.). The use of a Boolean operator on single bits or bit-vectors results in the creation of LOGIC nodes in the structure graph. MUX nodes are constructed when different assignment statements assign to the same variable, under different conditions. The outputs of the OP or LOGIC nodes that correspond to these conditions are used as select inputs to the MUX node to decide which assignment is executed in a given clock cycle. For example, consider the computations performed in state S2 of the schedule shown in FIG. 1. The corresponding structure graph is shown in FIG. 4($a$).

The algorithm for equivalence checking of structure graphs according to the present invention exploits the following assumptions:

The atomic nature of the OP nodes is preserved when generating the RTL circuit from the behavioral description.

If the RTL circuit instantiates macro-block components from an RTL library, it is assumed that the library components have been verified during library development, hence they implement their specified functionality (e.g. a library component ripple_carry_ adder does perform the addition operation correctly).

Arithmetic transformations (e.g. distributivity, replacing multiply by shifts and adds, etc.) are not performed. Note that while typical high-level synthesis tools do perform these transformations, they are performed prior to or concurrent with the scheduling step which generates the schedule.

Definition 7

Conditional Equivalence

A signal v in RSG is said to be conditionally equivalent to signals $u_1, u_2 \ldots u_n$ in $SSG_i$, if there exist corresponding conditions $c_1, c_2 \ldots c_n$, (a condition represents a non-empty set of value assignments to input variables in $SSG_i$ or RSG) such that under condition $c_k$, the value at signal v in RSG is guaranteed to be the same as the value at signal $u_k$ in $SSG_i$. The notation $(v \cong \{(u_1, c_1), \ldots, (u_n, c_n)\})$ is used to represent conditional equivalence relationships.

BDDs were used to represent the conditions involved in conditional equivalence relationships. See R. Bryant, "Graph-based algorithms for Boolean function manipulation," *IEEE Trans. Computers*, vol. C-35, pp. 677–691, August 1986. In general, the conditions themselves may be expressed in terms of the input variables, and may involve the results of various arithmetic and conditional operations. However, the conditions are expressed in terms of the outputs of OP and MUX nodes, in addition to IN nodes, which are collectively referred to as basis variables. In effect, BDDs are constructed only for the control logic (including the next state logic that feeds the PO, $R_{state}$_next and the logic that determines which paths through the MUX nodes are sensitized or how multi-function FUs are configured).

Figure 5:
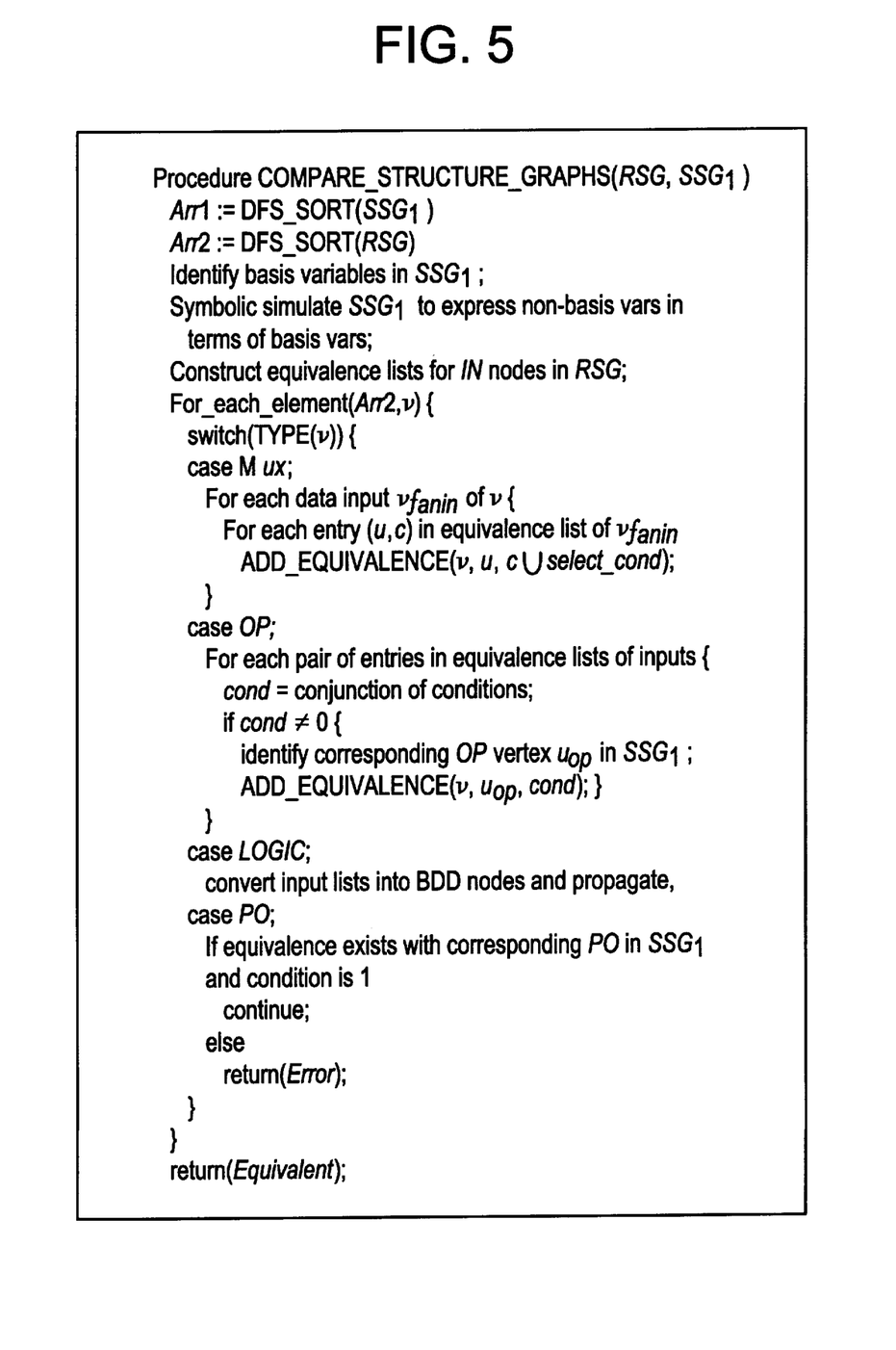
FIG. 5 shows symbolic simulation algorithm for equivalence checking of structure graphs.

The pseudo-code for the algorithm to compare $SSG_i$ and RSG is shown in FIG. 5. The algorithm starts with equivalence relationships for the IN nodes of RSG (these relationships are available since a 1-to-1 mapping exists between the IN nodes in RSG and $SSG_i$). The algorithm generates and propagates conditional equivalence relationships forward through the intermediate signals in RSG until the PO nodes are reached, and checks for unconditional equivalence between the output signals of RSG and $SSG_i$.

First, ordered sets Arr1 (Arr2) are populated to contain all the nodes in $SSG_i$ (RSG) such that each node appears only after all the nodes in its transitive fanin. This is done by performing a backward depth first search traversal from the OUT nodes towards the IN nodes. Next the basis variables in $SSC_i$ are identified as the outputs of PI, OP, and MUX nodes. A traversal through Arr1 is then performed, and for each node whose output does not correspond to a basis variable (i.e. each LOGIC node), the BDD for the output of the node is obtained in terms of the BDDs at its inputs. Each RSG node is associated with an equivalence list to represent the conditional equivalence relationships between its output and signals in $SSG_i$. An entry in the equivalence list is a pair (u,c) where u is an identifier for a $SSG_i$ signal, and c is a BDD representing the conditions for equivalence. The correspondence between the inputs of $SSG_i$ and RSG are used to create the equivalence lists for the IN nodes in RSG. Next, Arr2 is traversed, and each node is processed to propagate the equivalence lists from its inputs to its output. The techniques for propagating equivalence lists through OP, LOGIC, and MUX nodes are explained below. When a PO node of RSG is reached, the algorithm according to the present invention checks to see if an equivalence has been established with the corresponding OUT node in SSGi, and if the corresponding condition is a tautology. If not, the algorithm reports the RSC and $SSG_i$ as not being equivalent. Only if unconditional equivalences are obtained for all the OUT nodes of RSG does the algorithm declare RSC and $SSG_i$ to be equivalent.

Propagating Equivalence Relationships Through OP Nodes

Consider a two-input OP node v in RSG, whose inputs have equivalence lists $\{(x_i,c_1), \ldots, (x_m,c_m)\}$ and $\{(y_1, d_1), \ldots, (y_n, d_n)\}$. For each pair of entries (say, $(x_j,c_j)$ and $(y_k,d_k)$) in the input equivalence lists, we check whether the conjunction of the BDDs representing $c_j$ and $d_k$ results in a constant 0. If not, all corresponding OP nodes in $SSG_i$ are identified with inputs $x_j$ and $y_k$ that perform the same operation (i.e. +, −, <, etc.). For each OP node $u_1$ identified, the entry $(u_1,c_j$nd$_k)$ is added to the equivalence list of v.

Propagating Equivalence Relationships Through LOGIC Nodes

Since control logic may be introduced or removed by the process of transforming the schedule to the RTL circuit, it may not be possible to find equivalence relationships for the outputs of LOGIC nodes in RSG. Hence, rather than trying to compute equivalence relationships for LOGIC nodes, BDDs are computed which represent their outputs as functions of basis variables in $SSG_i$. Each fanin of a LOGIC node can have either an associated equivalence list (if it is a IN, MUX, or OP node), or an associated BDD (if it is another LOGIC' node). First equivalence lists for the LOGIC node inputs are converted to BDDs as follows. An equivalence list $\{(x_1, c_1), \ldots, (x_n, c_n)\}$ is converted to the expression $U_{i=1} x_i \cap c_i$, for which a BDD is computed using the BDDs for the conditions $c_i$ and BDDs representing the functions $f(x_i)=x_i$. Once BDDs are computed for all the inputs of the LOGIC node, it is possible to compute the BDD for its output by composing them appropriately.

Propagating Equivalence Relationships Through MUX Nodes

Consider a MUX node v with n data inputs $v_1 \ldots v_n$. If v is a decoded MUX node (there is a dedicated select input corresponding to each data input), the sensitization conditions $Sel_1, \ldots Sel_n$ are identified for its data inputs as the BDDs for the nodes feeding the corresponding select inputs. If v is an encoded MUX node (the select conditions for each data input are specified as a combination of values at the select inputs), the BDDs are composed for the nodes feeding the select inputs appropriately to obtain the sensitization conditions. The entries in the equivalence lists at the data inputs of the MUX node are then propagated to its output by taking the conjunction of the equivalence conditions with the sensitization condition for the appropriate data input. For example, consider an entry $(u_1, c_1)$ in the equivalence list of $v_1$. A corresponding entry $(u_1, c_1 \cap Sel_1)$ is added to the equivalence list for v. Note that multiple data inputs of a MUX may have equivalence relationships with the same $SSG_i$ signal, which may result in multiple entries with the same signal in the output equivalence list. The procedure for adding an entry to the equivalence list of a RSG signal avoids this by merging entries that refer to the same $SSG_i$ signal, as explained below.

Procedure ADD_EQUIVALENCE of FIG. 5, which is used to add an entry to the equivalence list of a RSG node will be explained next. When adding an entry (u,c) into an equivalence list $\{(u_1, c_1), \ldots, (u_n, c_n)\}$ for RSG node v, the procedure performs the following tasks:

If u feeds the input of a MUX node in $SSG_i$ whose output is u', the equivalence relationship between v and u is converted to an equivalence relationship between v and u', with equivalence condition $c \cap Sel_u$, where $SEL_u$ is the condition for u to be sensitized to u', and is computed as described in the previous paragraph. If u' itself fans out to other MUX nodes, this step is repeated. This step ensures that when the algorithm reaches an OP node in RSG, all relationships between its inputs and inputs of corresponding OP nodes in $SSG_i$ have been identified so that it can be processed just once.

It first checks to see if signal u is the same as any of the signals $u_1 \ldots u_n$. If $u = u_i$, $i \in [1,n]$, the entry $(u_i, c_i)$ is updated to $(u_i, c_i \cup c)$. This step helps reduce the size of equivalence lists, and thus improves the computational efficiency of the algorithm.

Experimental Results

There are three components to our verification system: (1) state-by-state checking, (2) gen-use conflict extraction, with the Verilog code of the corresponding subgraph as output, and (3) assertion checking using the VIS symbolic model checker back end. See R. K. Brayton et al., "VIS: A system for verification and synthesis," *Proc. Int. Conf. Computer-Aided Verification*, July 1996. Prototypes for (1) and (2) have been implemented so that the state-by-state checking, and the gen-use conflict and subgraph extraction is totally automatic. There might be situations where no gen-use subgraphs are generated even in the presence of register sharing. In that case, VIS would not need to be called. Described here are the results obtained with two illustrative example designs.

The first example that is considered is the schedule of FIG. 1. Its RTL implementation is shown as a structure graph in FIG. 6. For the sake of clarity, all LOGIC nodes have been converted to the Boolean equations inside the box. Also, the multiplexer marked (i) has its select input connected to signal Sel(i) and its output is named m(i). Variables raddr1 and raddr2 which are mapped to the same register, R1, in the RTL implementation, are focused on. Algorithm for identifying gen use conflicts according to the present invention (FIG. 2) identified four sub-graphs with gen-use conflicts, resulting from the assignment of raddr1 (raddr2) to in state s1 and the use of raddr2 (radd1) in state s2. In this example, all four cases are benign gen-use conflicts due to the correlation between the value of variable p used in the CASE operation in s1 and the variable x used in the if construct in state s2. One such sub-graph, after the pruning of irrelevant operations, is shown in FIG. 1(c). Verilog code for the sub-graph and the CTL assertion for verifying its benignness, have been generated. The VIS symbolic model checking system was able to easily prove the assertion to be true in 2.2 seconds on a Sun Ultra 10 workstation with 246 MB memory. See R. K. Brayton et al., "VIS: A system for verification and synthesis," *Proc. Int. Conf. Computer-Aided Verification*, July 1996.

The state-by-state equivalence check has also been performed between the schedule (FIG. 1) and the RTL implementation (FIG. 6). This process is illustrated for state s1, whose structure graph, $SSG_i$, is shown in FIG. 4. For each of the variables not shown in FIG. 4 (maddr, raddr, ir, p), $SSG_1$ contains a PI node that directly feeds a corresponding PO node, requiring the variable to retain the previous cycle's value. The pre-processing steps assign the values 0 and 1 at the present state lines PS1 and PS0 in the RTL circuit, and replace the $R_{state}$_next and s2 in the schedule with the bit-vector <NS1, NS0> and the constant <0,1>, respectively. The symbolic simulation of $SSG_1$ results in the construction of BDDs for the outputs of the four LOGIC nodes (u7 . . . u10) of FIG. 4 in terms of the basis variables u0 . . . u3. The equivalence lists of the IN nodes of the RSG are created based on the input correspondences with $SSG_1$. The conditions for the input equivalence relationships is set to the function 1. First, the algorithm considers the CASE node in the RSG. The corresponding CASE node in $SSG_1$ has an equivalent input signal, c3 . . . c0 in RSG are set to be equivalent to u3 . . . u0 in $SSG_1$. Next, the LOGIC nodes corresponding to the Boolean equations in the box of FIG. 6 are processed, leading to the following expressions: NS1= 1, NS0=0, Sel(0)=Sel(5)=u1, Sel(6)=u3, Sel(7)=Sel(11)= u2, Sel(13)=u1+u2, Sel(1)=Sel(2)=Sel(3)=Sel(4)=Sel(9)= Sel(10)=Sel(15)=0, Sel(8)=Sel(12)=Sel(14)=1.

The remaining nodes in the RSG are evaluated leading to the following sequence of conclusions:

m(0)≅(stack,ul),(data, 1)
m(1)≅(stack 1)
m(2)≅(off1,1)
m(3)≅(p,1)
m(4)≅(ir,1)
m(5)≅(addr_next, u0+u1)
m(6)≅(addr_next, u2+u3)
m(7)≅(addr_next, 1)
m(8)≅(addr_next, u2+u3)
m(9)≅(addr_next, u0)
m(10)≅(maddr, 1)
m(11)≅(R1_next, 1)
m(12)≅(maddr, 1)
m(13)≅(z_next, 1)
m(14)≅(maddr, 1)
m(15)≅(raddr, 1)
v1≅(addr_next, u1)
v2≅(addr_next, u0)

It can be easily seen that propagating the equivalence lists through the PO nodes in RSG leads to the desired result.

The second example is an implementation of a binary-tree sort algorithm. The code cannot be provided here for lack of space. Suffice to say that the algorithm consists of two parts: the first part generates the sorted binary tree, while the second part walks the tree and outputs the data values in the correct order. The two parts follow each other in time, making it possible to share registers between variables whose life times are restricted to one of the two parts. There is little arithmetic in this algorithm except incrementing the input data index when data is read in, the < operator when two data are compared, and incrementing and decrementing the stack pointer during the tree walk. The state-by-state comparison is, therefore, quite straightforward and the schedule and implementation passed this test. The gen-use test, on the other hand, told use that a gen-use conflict did exist and that at least one path from gen to use was actually sensitizable. Careful study of the schedule has shown that an assignment to one of the variables sharing the register and the use of that variable had been incorrectly placed in the same control state in the tree-walk part of the algorithm. This was, therefore, a case of a bad specification that got highlighted because it led to incorrect register sharing. After the schedule has been corrected, the gen-use check also passed trivially since no gen-use subgraph was generated.

CONCLUSION

A complete procedure for verifying register-transfer logic against its scheduled behavior in a high-level synthesis environment according to the present invention is the first step in overall strategy to develop tools for validating a structural RTL implementation against its highest level initial description. It is the first such verification procedure that is both complete and practical. Knowledge of the scope of the synthesis steps is used to partition the equivalence checking task into that of proving multiple subproperties, some of which can be checked locally in each control state, while the others must be checked by checking simple assertions on the entire state space using a symbolic model checker. By checking only simple assertions at a time, and by abstracting out the irrelevant portions of the design in checking each assertion, the task that must be performed by the symbolic model checker has been significantly simplified. The entire process of identifying the assertions to check, performing the abstractions, and carrying out the checks is automatic. This practice of taking advantage of the limitations in the scope of each synthesis step can be used for validating against levels of abstraction higher than scheduled behavior.

What is claimed is:

1. A method of specification for verification of a structural register-transfer level implementation of a scheduled behavioral, said method comprising the steps of verifying the validity of register sharing and checking intra-cycle equivalence.

2. The method of claim 1 wherein the step of verifying validity of register sharing further comprises:
   (a) identifying graph formed by a plurality of paths along which gen-use conflicts occur; and
   (b) verifying the benignness of each of said gen-use conflicts.

3. The method of claim 1 wherein the step of verifying the validity of register sharing further comprises a step of checking for any register $R_i$ in the implementation the validity of a condition whether either the corresponding set $M_i$ has only one element, or $M_i$ has multiple elements, but all conflicting gen-use pairs for said register are benign.

4. The method of claim 1 wherein in step (a) of verifying intracycle equivalence is performed by symbolic simulation-based equivalence checking using uninterpreted functions.

5. The method of claim 2 wherein in step (b) paths along which said gen-use conflicts occur are identified using a depth-first search procedure.

6. The method of claim 2 wherein in step 2 the benignness of each of said gen-use conflicts is verified by testing falsity of all the paths from said graph.

7. A method of symbolic simulation for checking equivalence of a schedule structure graph (SSG) and an RTL structure graph (RSG) comprising:
   (a) creating ordered sets of nodes Arr1 corresponding to SSG and Arr2 corresponding to RSG such that each node appears in said ordered sets only after all corresponding nodes in a transitive fanin of said each node appear in said ordered sets;
   (b) identifying base variables in SSG as outputs of one of primary input (PI), operator (OP) and multiplexer (MUX) nodes;
   (c) traversing through Arr1 for each node in Arr1 whose output does not correspond to said base variables to obtain binary decision diagrams (BDDs) of outputs based on BDDs of inputs;
   (d) associating each node in RSG with an equivalence list, said equivalence list representing a conditional equivalence relationship between outputs of said each node in RSG and signals in SSG, wherein an entry in said equivalence list is a pair (u,c), wherein u is an identifier for a signal in SSG and c is a BDD representing conditions for equivalence;
   (e) traversing through Arr2 and processing each node in Arr2 to propagate equivalence lists from inputs of said each node in Arr2 to outputs of said each node in Arr2;
   (f) checking to see if an equivalence has been established with corresponding OUT node in SSG and if corresponding condition is a tautology, said checking being performed when a primary output (PO) node of RSG is reached;
   (g) declaring RSG and SSG to be equivalent if all OUT nodes of RSG are unconditionally equivalent in step f and each out node in the SSG is unconditinoally equivalent to some out node in the RSG; and
   (g) declaring RSG and SSG to be not equivalent if at least one OUT node of RSG is not unconditionally equivalent in step f.

8. The method of claim 4 wherein symbolic simulation for checking equivalence of a schedule structure graph (SSG) and an RTL structure graph (RSG) is done by a method comprising:
   (i) creating ordered sets of nodes Arr1 corresponding to SSG and Arr2 corresponding to RSG such that each node appears in said ordered sets only after all corresponding nodes in a transitive fanin of said each node appear in said ordered sets;
   (ii) identifying base variables in SSG as outputs of one of primary input (PI), operator (OP) and multiplexer (MUX) nodes;
   (iii) traversing through Arr1 for each node in Arr1 whose output does not correspond to said base variables to obtain binary decision diagrams (BDDS) of outputs based on BDDs of inputs;
   (iv) associating each node in RSG with an equivalence list, said equivalence list representing a conditional equivalence relationship between outputs of said each node in RSG and signals in SSG, wherein an entry in said equivalence list is a pair (u,c), wherein u is an identifier for a signal in SSG and c is a BDD representing conditions for equivalence;
   (v) traversing through Arr2 and processing each node in Arr2 to propagate equivalence lists from inputs of said each node in Arr2 to outputs of said each node in Arr2;

(vi) checking to see if an equivalence has been established with corresponding OUT node in SSG and if corresponding condition is a tautology, said checking being performed when a primary output (PO) node of RSG is reached;

(vii) declaring RSG and SSG to be equivalent if all OUT nodes of RSG are unconditionally equivalent in step vi and each out node in the SSG is unconditinoally equivalent to some out node in the RSG; and (viii) declaring RSG and SSG to be not equivalent if at least one OUT node of RSG is not unconditionally equivalent in step vi.

* * * * *

UNITED STATES PATENT AND TRADEMARK OFFICE
CERTIFICATE OF CORRECTION

PATENT NO. : 6,163,876
DATED : December 19, 2000
INVENTOR(S) : Pranav Ashar, Subhrajit Bhattacharya, Anand Raghuthan, Akira Mukaiyama It is certified that error appears in the above-identified patent and that said Letters Patent is hereby corrected as shown below:

Abstact,
Line 13, delete "RyL" insert -- RTL --

Column 16,
Line 2, delete "(radd1)" insert -- Craddr 1 --;
Line 35, delete uO" insert -- u0 --

Signed and Sealed this

Thirty-first Day of July, 2001

Attest:

NICHOLAS P. GODICI
Attesting Officer    Acting Director of the United States Patent and Trademark Office